United States Patent
Akopyan et al.

(10) Patent No.: US 10,838,860 B2
(45) Date of Patent: *Nov. 17, 2020

(54) MEMORY-MAPPED INTERFACE TO MESSAGE-PASSING COMPUTING SYSTEMS

(71) Applicant: INTERNATIONAL BUSINESS MACHINES CORPORATION, Armonk, NY (US)

(72) Inventors: Filipp A. Akopyan, New Windsor, NY (US); John V. Arthur, Mountain View, CA (US); Andrew S. Cassidy, San Jose, CA (US); Michael V. DeBole, Poughkeepsie, NY (US); Paul A. Merolla, Palo Alto, CA (US); Dharmendra S. Modha, San Jose, CA (US); Jun Sawada, Austin, TX (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/567,159

(22) Filed: Sep. 11, 2019

(65) Prior Publication Data

US 2020/0004678 A1    Jan. 2, 2020

Related U.S. Application Data

(63) Continuation of application No. 15/789,472, filed on Oct. 20, 2017, now Pat. No. 10,452,540.

(51) Int. Cl.
*G06F 12/06* (2006.01)
*G06F 12/1027* (2016.01)
(Continued)

(52) U.S. Cl.
CPC ........ *G06F 12/063* (2013.01); *G06F 12/1027* (2013.01); *G06N 3/063* (2013.01);
(Continued)

(58) Field of Classification Search
CPC ........ G11C 7/1057; G06N 3/063; G06N 3/10; G06F 12/063; G06F 12/1027
(Continued)

(56) References Cited

U.S. PATENT DOCUMENTS

| 5,214,747 A | 5/1993 | Cok |
| 5,956,703 A | 9/1999 | Turner et al. |

(Continued)

FOREIGN PATENT DOCUMENTS

| CN | 103117933 A | 5/2013 |
| CN | 104915302 A | 9/2015 |
| EP | 3098762 A1 | 11/2016 |

OTHER PUBLICATIONS

Esser et al., "Cognitive computing systems: Algorithms and applications or networks of neurosynaptic cores," Int Joint Conf Neural Net (ICJNN), 2013.

(Continued)

*Primary Examiner* — Reginald G Bragdon
*Assistant Examiner* — Aaron D Ho
(74) *Attorney, Agent, or Firm* — Erik A. Huestis; Stephen J. Kenny; Foley Hoag, LLP

(57) ABSTRACT

Memory-mapped interfaces for message passing computing systems are provided. According to various embodiments, a write request is received. The write request comprises write data and a write address. The write address is a memory address within a memory map. The write address is translated into a neural network address. The neural network address identifies at least one input location of a destination neural network. The write data is sent via a network according- (Continued)

ing to the neural network address to the at least one input location of the destination neural network. A message is received via the network from a source neural network. The message comprises data and at least one address. A location in a buffer is determined based on the at least one address. The data is stored at the location in the buffer. The buffer is accessible via the memory map.

20 Claims, 11 Drawing Sheets

(51) Int. Cl.
*G06N 3/063* (2006.01)
*G06N 3/10* (2006.01)
*G11C 7/10* (2006.01)
*G11C 11/54* (2006.01)

(52) U.S. Cl.
CPC .............. *G06N 3/10* (2013.01); *G11C 7/1057* (2013.01); *G11C 11/54* (2013.01)

(58) Field of Classification Search
USPC ........................................................ 711/202
See application file for complete search history.

(56) References Cited

U.S. PATENT DOCUMENTS

| 7,620,791 | B1 | 11/2009 | Wentzlaff et al. |
| 7,624,248 | B1 | 11/2009 | Wentzlaff et al. |
| 8,489,854 | B1 | 7/2013 | Colon et al. |
| 2018/0089562 | A1 | 3/2018 | Jin et al. |
| 2018/0189645 | A1 | 7/2018 | Chen et al. |
| 2018/0189981 | A1 | 7/2018 | Singh et al. |

OTHER PUBLICATIONS

International Search Report and Written Opinion for International Application No. PCT/IB2018/057922 dated Feb. 13, 2019.
Painkras et al., "SpiNNAker: A 1-W 18-Core System on Chip for Massively-Parallel Neural Network Simulation," IEEE J Solid-State Circuits, 48(8):1943-1953 (2013).
Pearson et al., "Implementing Spiking Neural Networks for Real-Time Signal-Processing and Control Applications: A Model-Validated FPGA Approach," IEEE Transactions on Neural Networks, 18(5):1472-1487 (2007).
Chakradhar et al., "A dynamically configurable coprocessor for convolutional neural networks," SIGARCH Comput Archit News, 38:247-257 (2010).

MEMORY-MAPPED INTERFACE TO MESSAGE-PASSING COMPUTING SYSTEMS

CROSS-REFERENCE TO RELATED APPLICATIONS

This application is a continuation of U.S. application Ser. No. 15/789,472, filed Oct. 20, 2017, which is hereby incorporated by reference in its entirety.

BACKGROUND

Embodiments of the present disclosure relate to interfaces to message passing systems, and more specifically, to memory-mapped interface for message passing computing systems.

BRIEF SUMMARY

According to embodiments of the present disclosure, methods of and computer program products for interfacing a memory mapped system with a message passing system are provided. A write request is received. The write request comprises write data and a write address. The write address is a memory address within a memory map. The write address is translated into a neural network address. The neural network address identifies at least one input location of a destination neural network. The write data is sent via a network according to the neural network address to the at least one input location of the destination neural network. A message is received via the network from a source neural network. The message comprises data and at least one address. A location in a buffer is determined based on the at least one address. The data is stored at the location in the buffer. The buffer is accessible via the memory map.

According to embodiments of the present disclosure, systems for interfacing with neural network processing systems are provided. A neural network processing system comprises at least one neural network processing core interconnected by a networks. An interface is operatively connected to the network. The interface comprises a memory map. The memory map comprises a first region corresponding to inputs to the neural network processor system and a second region corresponding to outputs from the neural network processor system. The interface is adapted to receive a write request comprising write data and a write address. The write address corresponds to a location within the first region of the memory map. The interface is adapted to send the write data via the network to at least one input location of a destination neural network processing core. The interface is adapted to receive a read request comprising a read address. The read address corresponds to a location within the second region of the memory map. The interface is adapted to return read data to an originator of the read request. The read data comprises the output of a source neural network processing core.

DETAILED DESCRIPTION

Figure 1:
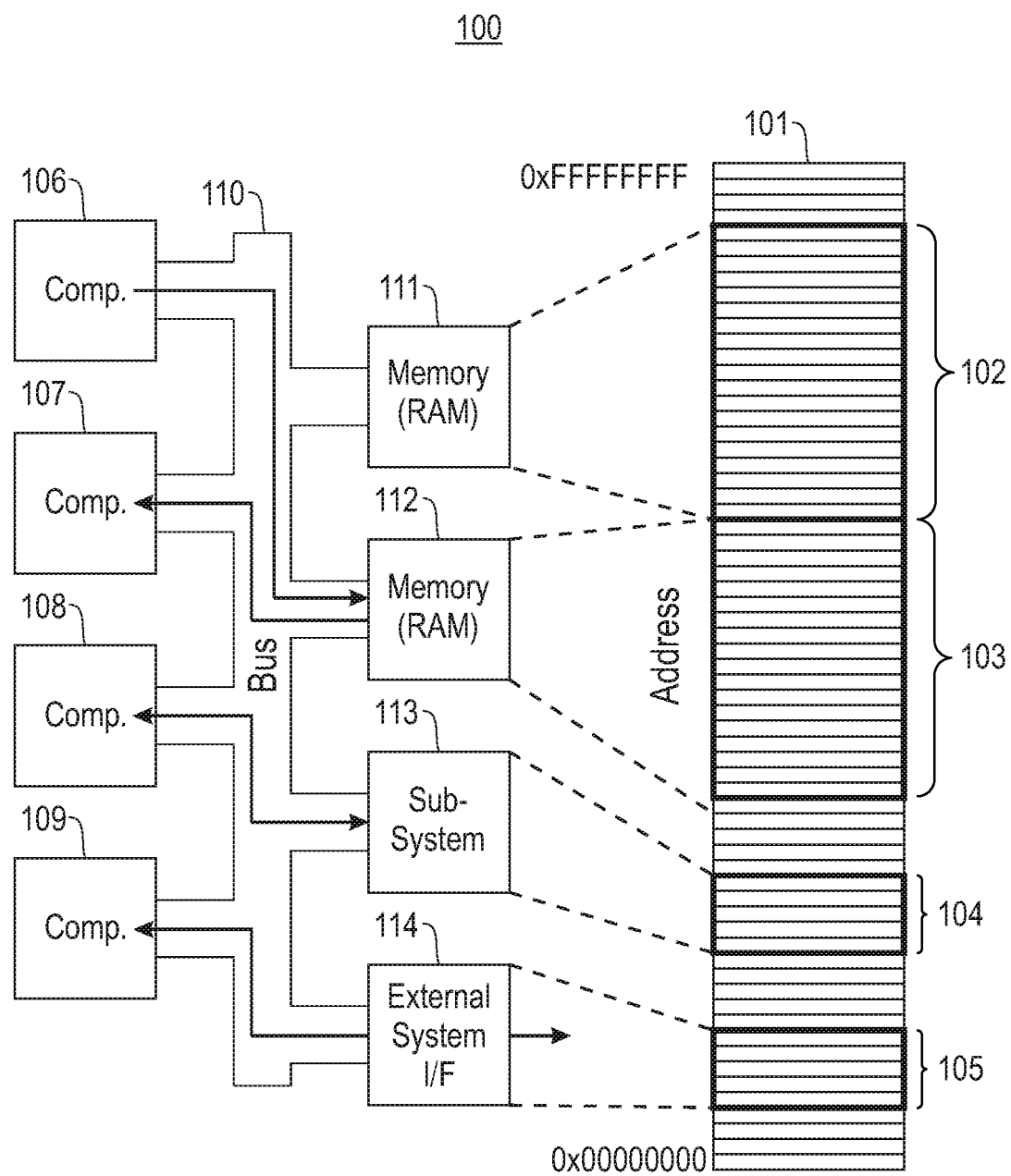
FIG. 1 illustrates an exemplary memory-mapped (MM) system according to embodiments of the present disclosure.

Various traditional computing systems communicate between system components via a shared memory/memory mapped (MM) paradigm. In contrast, various parallel, distributed computing systems, such as neurosynaptic systems, intercommunicate via a message passing (MP) paradigm. The present disclosure provides for efficient interfaces between these two types of systems.

Various exemplary embodiments provided herein are described in terms of neurosynaptic spike-based systems. However, it will be appreciated that the present disclosure is applicable to any message passing system including distributed systems, neurosynaptic systems, and other non-von Neumann systems.

In various neurosynaptic systems, arrays of extremely low power neurosynaptic processing units, called neurosynaptic cores, provide an architecture to solve exascale and big data problems. These cores use spikes to encode information. In a network of neurosynaptic cores, neurons on each core can connect to any axon of any other neurosynaptic core (including itself). When a neuron spikes, it sends a spike packet that gets delivered to a target axon on a destination core.

In digital spiking neuromorphic systems, information is represented and delivered by spikes, where each spike is a digital packet of information, carrying one or more bits. For example, the IBM TrueNorth chip is a digital spiking neuromorphic system where each spike carries a single bit of information (a binary spike). Spiking neural networks such as TrueNorth are based on delivering packets of information over switched communication wires, thereby significantly reducing the required wiring. The presence of a spike is treated as receiving a 1, its absence represents a 0. More values can be coded into binary spikes using several different spike coding schemas.

A spike communication from a source neuron on a source core, to a target axon on a destination core, would effectively need to traverse certain number of hops via routers in a 2D grid in either the horizontal or vertical or a combination of both to be delivered to the target axon on a destination core. Each hop a spike packet traverses, consumes power and energy.

Within an exemplary neuromorphic system such as TrueNorth, a fixed amount of time is allowed for a spike to travel from its source neuron to its destination axon. This fixed window is referred to as a tick. The time a spike requires for its journey varies based on the distance the spike must travel and the number of 2-D mesh routing, chip and board interfaces that the spike travels across.

On each tick, the neurons in a core are processed sequentially, starting with the first neuron and continuing through the last neuron. Accordingly, in addition to the transmission delays discussed above, each spike is also delayed by some additional fixed amount based on which neuron on a core generated it. For example, in an exemplary neuromorphic system such as TrueNorth having 256 neurons per core, the 256th neuron is not processed until the preceding 255 neurons are processed.

According to various embodiments of the present disclosure, a neurosynaptic program represents a neurosynaptic network. A neurosynaptic program includes information relating to the neurosynaptic network. In some embodiments, the information includes neuronal properties and dynamics that determine an electronic neuron's response to input spikes. For example, neuronal properties and dynamics can include a threshold parameter, a leak parameter, a delay parameter, or a reset parameter. In some embodiments, the neurosynaptic program information includes synaptic connections of the neuron (e.g., synaptic connections made via a synaptic crossbar). In some embodiments, the neurosynaptic program information includes axon properties (e.g., axon types). In some embodiments, the neurosynaptic program information includes one or more destinations (e.g., target axons) that the neuron's output spike should be delivered to.

According to various embodiments, a neurosynaptic network represents an instantiation of a neurosynaptic program. A neurosynaptic network may be instantiated in hardware, in simulation or in both. For example, a neurosynaptic program may give rise to one or more instances of a neurosynaptic network, wherein the instances may reside on a single core, multiple cores, or multiple chips.

According to various embodiments, a neuromorphic core circuit represents an example neurosynaptic network described by a neurosynaptic program.

According to various embodiments, a corelet or a Corelet Programming Language represent software that provide abstraction of neurosynaptic programs. A composition of neurosynaptic programs may be created by composing corelets.

A TrueNorth program is a complete specification of a network of neurosynaptic cores, along with its external inputs and outputs. In various embodiments, a divide-and-conquer approach is adopted whereby a large network of neurosynaptic cores is constructed by interconnecting a set of smaller networks of neurosynaptic cores, where each of the smaller networks, in turn, could be constructed by interconnecting a set of even smaller networks, and so on, down to a network consisting of a single neurosynaptic core, which is the fundamental non-divisible building block. This programming paradigm is referred to as Corelet Programming.

Referring to FIG. 1, an exemplary memory-mapped system 100 is illustrated. Memory map 101 is segmented and regions 102 . . . 105 are allocated to various system components. Computational cores 106 . . . 109, e.g., processor cores on one or more chips, are connected to bus 110. Each core 106 . . . 109 is connected to bus 110, and can intercommunicate through shared memory 111 . . . 112, which correspond to addressable regions of the memory map 102 . . . 103. Each core 106 . . . 109 can communicate with subsystem 113 through an addressable region 104 of the memory map 101. Similarly, each core 106 . . . 109 can communicate with an external system 114 through an addressable region 105 of the memory map 101.

Memory map (MM) addresses are in relation to the global memory map, in this example running from 0x00000000 to 0xFFFFFFFF.

Figure 2:
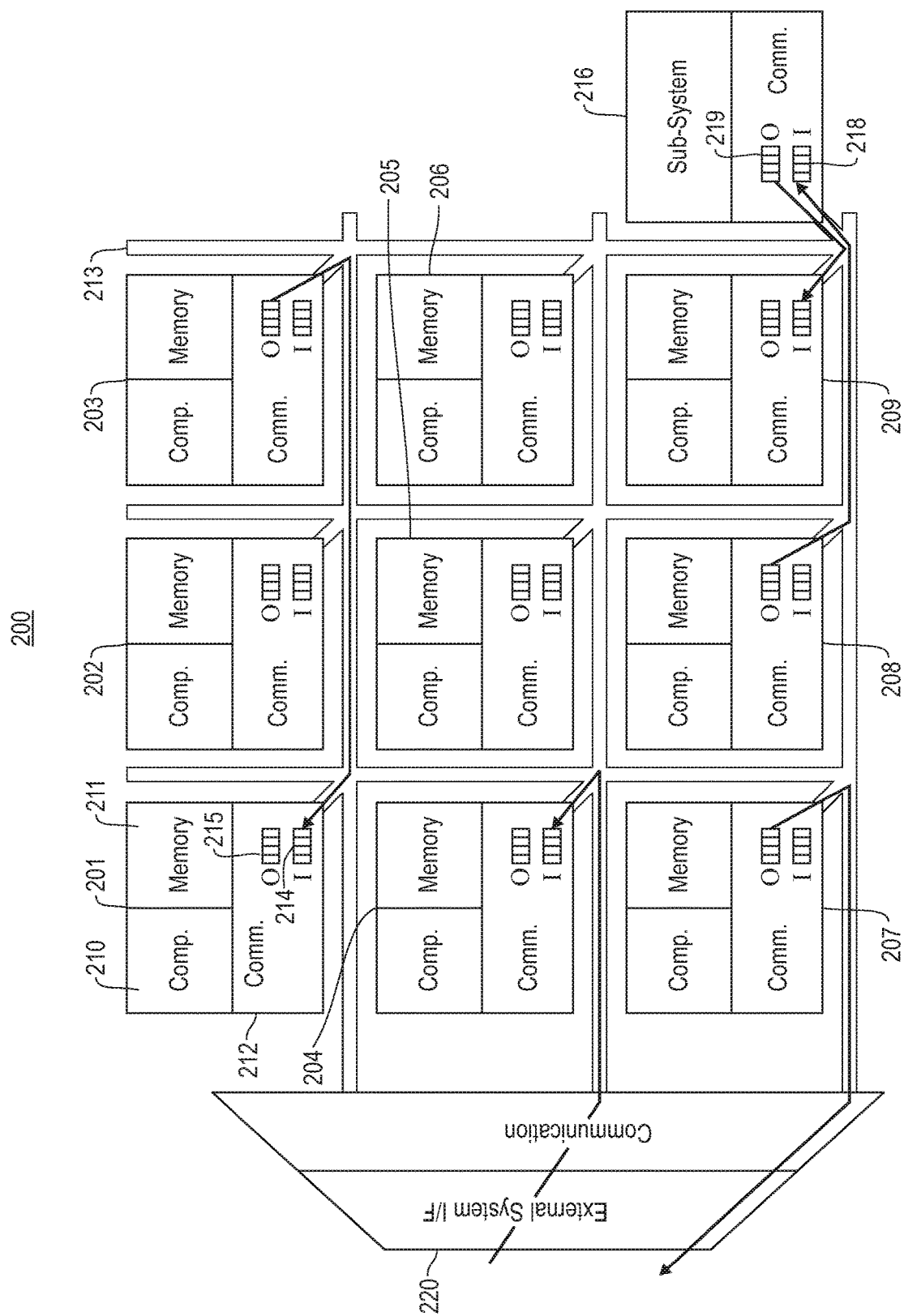
FIG. 2 illustrates an exemplary message passing (MP) system according to embodiments of the present disclosure.

Referring to FIG. 2, an exemplary message passing (MP) system 200 is illustrated. A plurality of cores 201 . . . 209 each comprise a computational core 210, a memory 211, and communication interface 212. Each of cores 201 . . . 209 is connected by network 213. Communication interface 212 comprises an input buffer 214 and an output buffer 215 for injecting and receiving packets to/from the network 213. In this way, cores 201 . . . 209 may intercommunicate by passing messages.

Similarly, subsystem 216 may be connected to network 213 via communication interface 217 having input buffer 218 and output buffer 219. External systems may be connected to network 213 via interface 220. In this way, cores 201 . . . 209 may communicate with subsystems and external systems by passing messages.

Message-passing (MP) addresses are in relation to network addresses local to the core. For example, an individual core may be identified by its X,Y position on a chip, while the local addresses may be used for buffer or memory local to an individual core.

Figure 3:
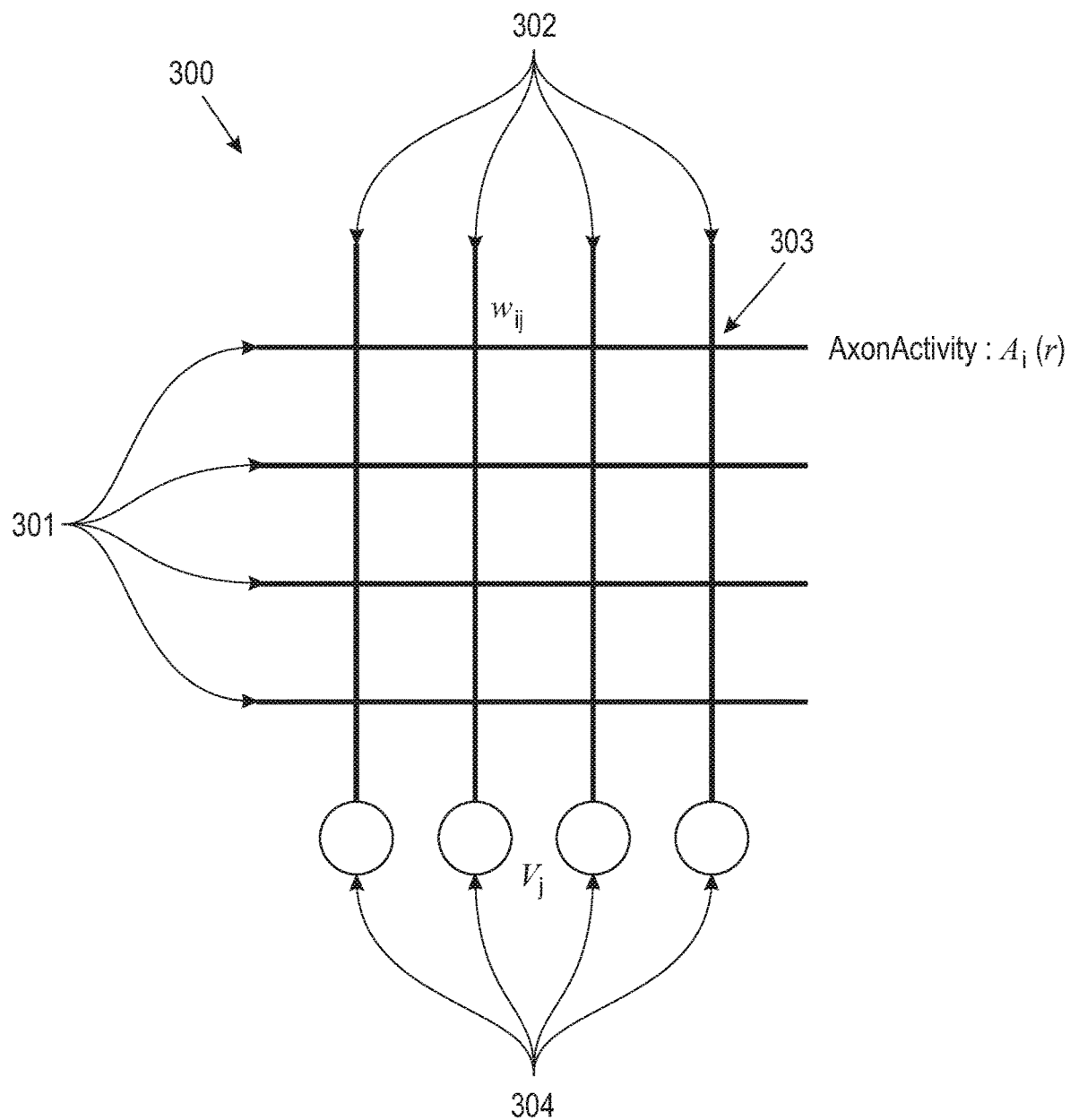
FIG. 3 depicts a neurosynaptic core according to embodiments of the present disclosure.

With reference now to FIG. 3, a neurosynaptic core according to embodiments of the present disclosure is depicted. In some embodiments, neurosynaptic core 300 includes axons 301, represented as rows, dendrites 302, represented as columns, synapses 303, represented as row-column junctions, and neurons 304 that receive inputs from dendrites. In some embodiments, there are 256 axons, and 256 neurons. In such embodiments, there are 256×256=65,536 synapses. Information flows from axons 301 to the neurons 304, modulated by the synapses 303. In various embodiments, the synapses may be binary, and may be associated with synaptic weights.

Figure 4:
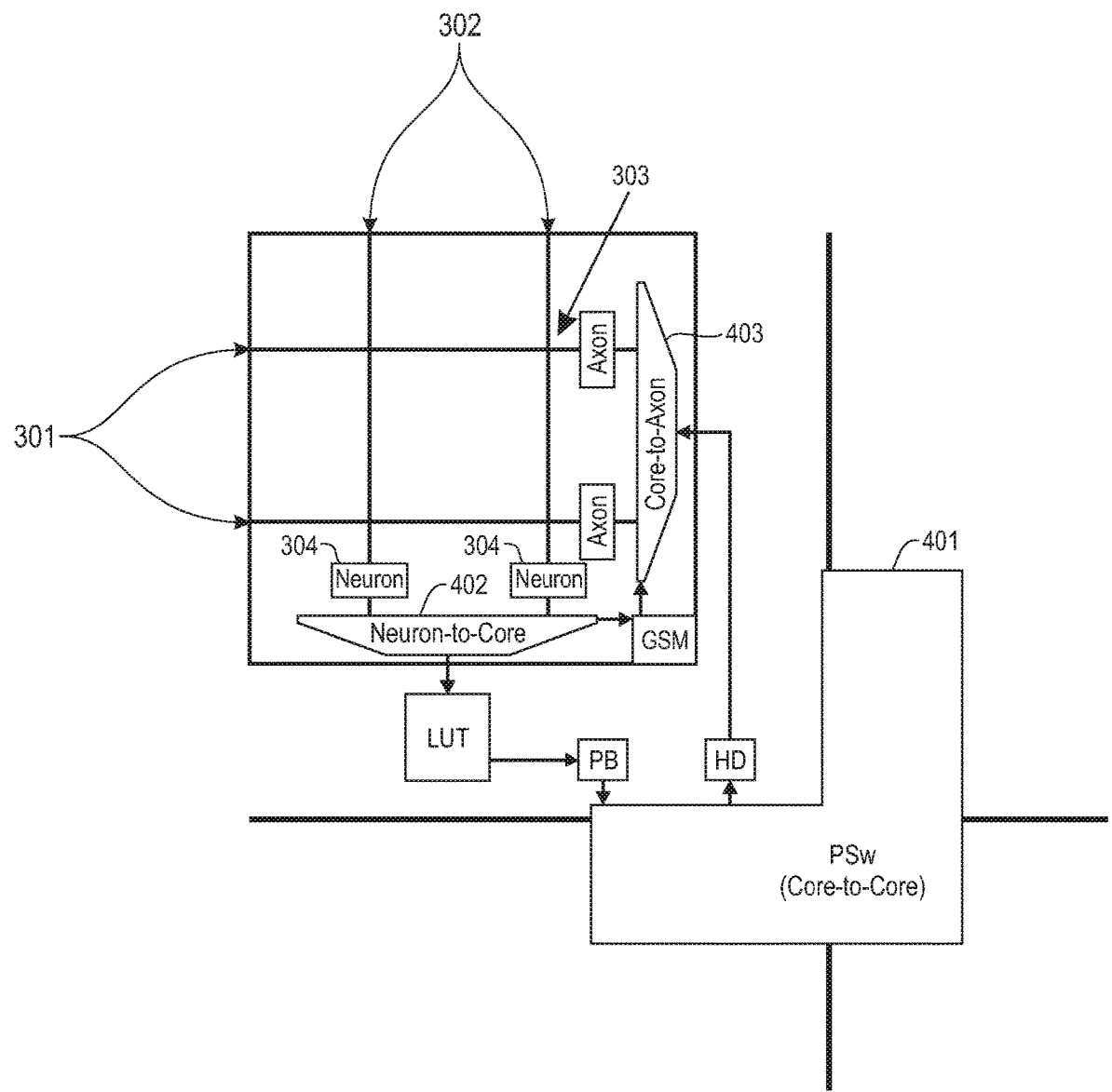
FIG. 4 depicts a neurosynaptic core and mesh router according to embodiments of the present disclosure.

In some embodiments a plurality of neurosynaptic cores are tiled on a chip. In an exemplary embodiments, a 64 by 64 grid of cores is tiled, yielding 4,096 cores, for a total of 1,048,576 neurons and 268,435,456 synapses. In such embodiments, neurons, synapses, and short-distance connectivity are implemented by the core circuit. Long-distance connectivity is logical. An exemplary embodiment is depicted in FIG. 4. Mesh router 401 provides communication between cores. Also on a given core, neuron to core 402 and core to axon 403 communication links are provided.

Figure 5:
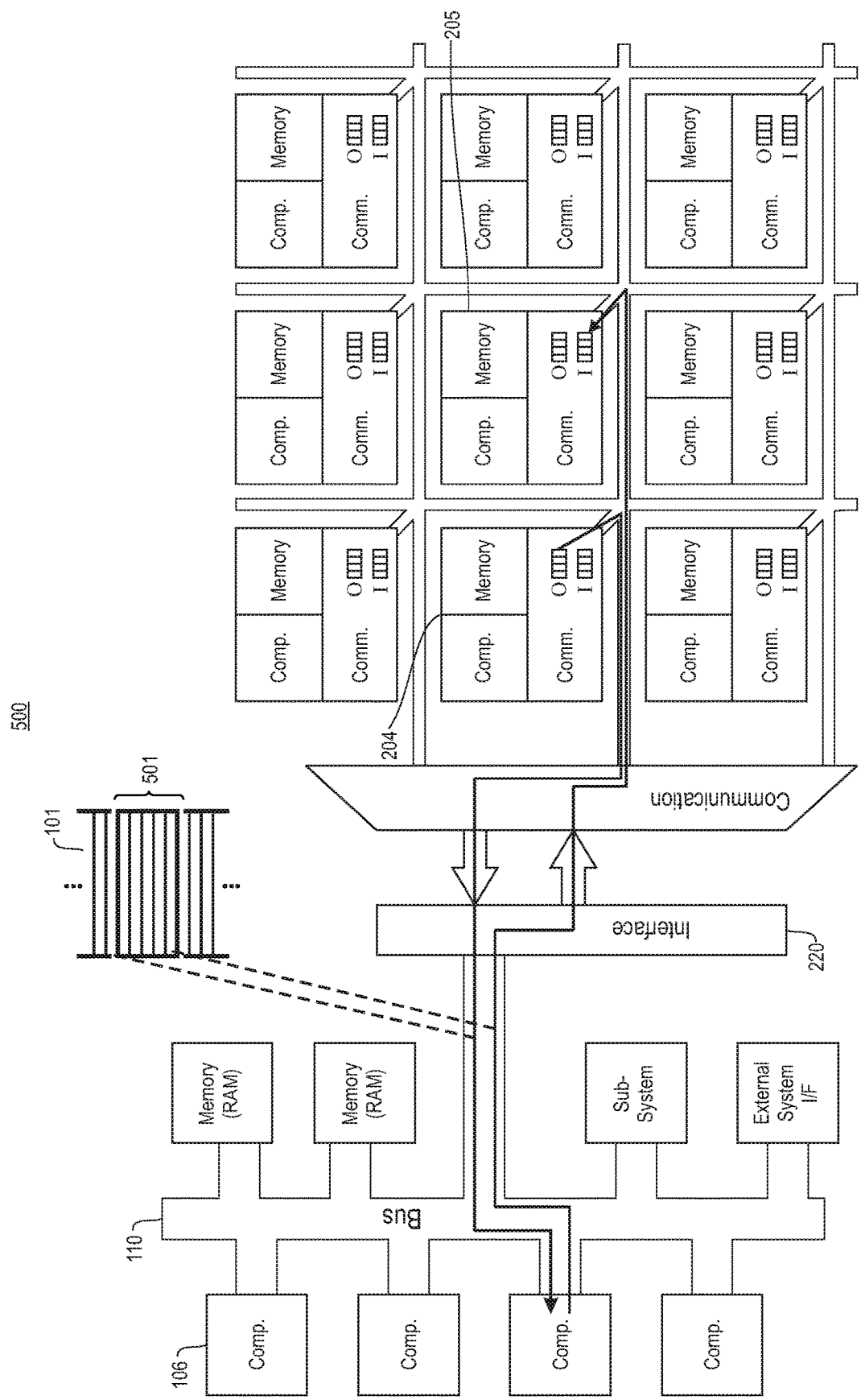
FIG. 5 illustrates a combined memory mapped and message passing system according to embodiments of the present disclosure.

With reference now to FIG. 5, a combined memory mapped and message passing system 500 is illustrated according to various embodiments of the present disclosure. A memory space 501 within global memory map 101 is provided for interfacing with the message passing system. Interface 220 translates addresses between the domains of the memory mapped and message passing systems. In this way, the message passing I/O buffers of each core in the message passing system appear in and are accessible through memory map 101.

Figure 6:
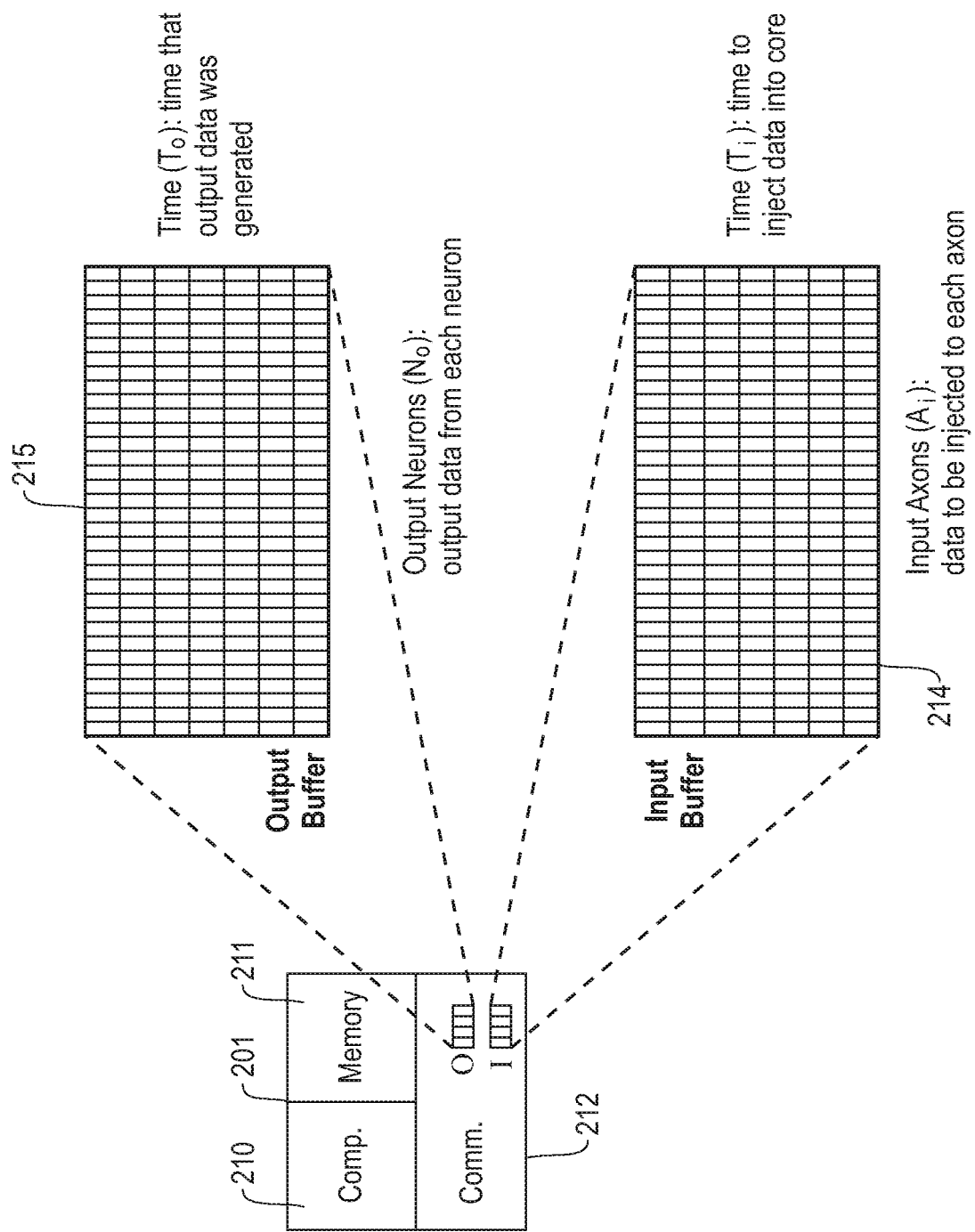
FIG. 6 illustrates input and output buffers of an exemplary core according to embodiments of the present disclosure.

With reference now to FIG. 6, input and output buffers 214, 215 of an exemplary core 201 are illustrated according to various embodiments of the present disclosure. In this exemplary core, the computational core 210 provides neuron computation, for example as in the neurosynaptic systems described above with regard to FIGS. 3-4. Communication interface 212 provides neural spike events from the neuronal computation 210. In neurosynaptic systems such as those described above, local memory 211 comprises the synaptic crossbar and local parameters to the core.

In this exemplary embodiment, output buffer 215 includes data from each output neuron ($N_o$) at a plurality of output times ($T_o$). Input buffer 214 similarly includes data to be injected to each input axon ($A_i$) at a plurality of input times ($T_i$).

Figure 7:
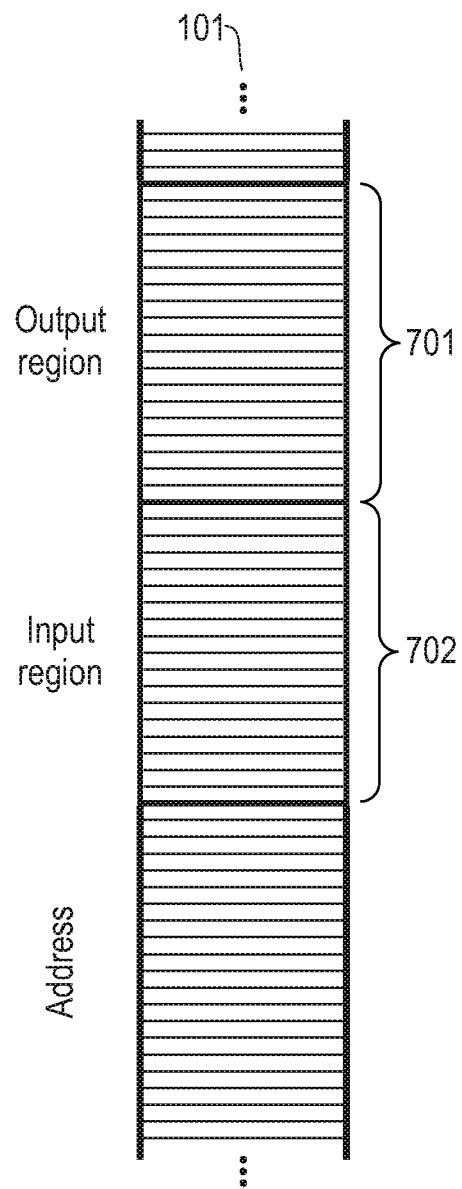
FIG. 7 illustrates an exemplary memory map according to embodiments of the present disclosure.

With reference now to FIG. 7, an exemplary memory map 101 is illustrated according to various embodiments of the present disclosure. A message passing portion of memory map 101 is segmented into an input (axon) region 702 and an output (neuron) region 701. For $C_o$ output cores, the output memory region 701 size is $C_o*T_o*N_o*B_o$, where $B_o$ is the number of bits of output data per axon. Likewise, for $C_i$ input cores, the input memory region size is $C_i*T_i*A_i*B_i$, where $B_i$ is the number of bits of the input data per neuron.

Figure 8:
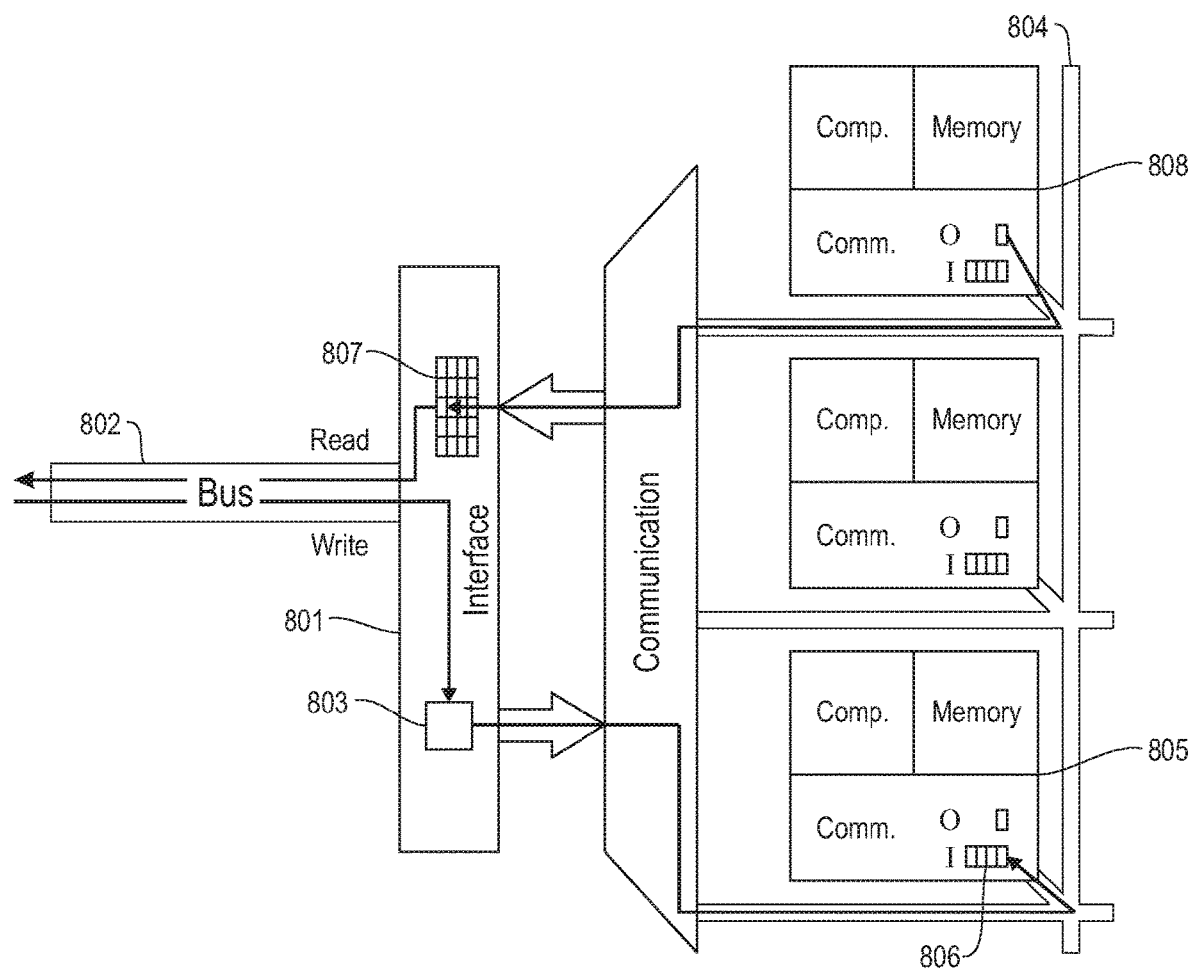
FIG. 8 illustrates an exemplary memory mapped interface for message passing systems according to embodiments of the present disclosure.

With reference now to FIG. 8, an exemplary memory mapped interface for message passing systems is illustrated according to embodiments of the present disclosure. An interface 801 is coupled to and accessible through bus 802. Write requests are received at interface 801, which is addressable via a memory map. Write requests are directed to memory addresses. Address translation unit 803 of interface 801 converts memory addresses to message core addresses. As noted above, memory addresses may be inters of an offset within a memory, while core addresses may comprise a core name, or an X,Y core address. Written data is then delivered to a destination core using the message address output from address translation unit 803. As discussed above, the data may be transmitted over a network 804, and then added to an input buffer 805 included in core 806.

Figure 11:
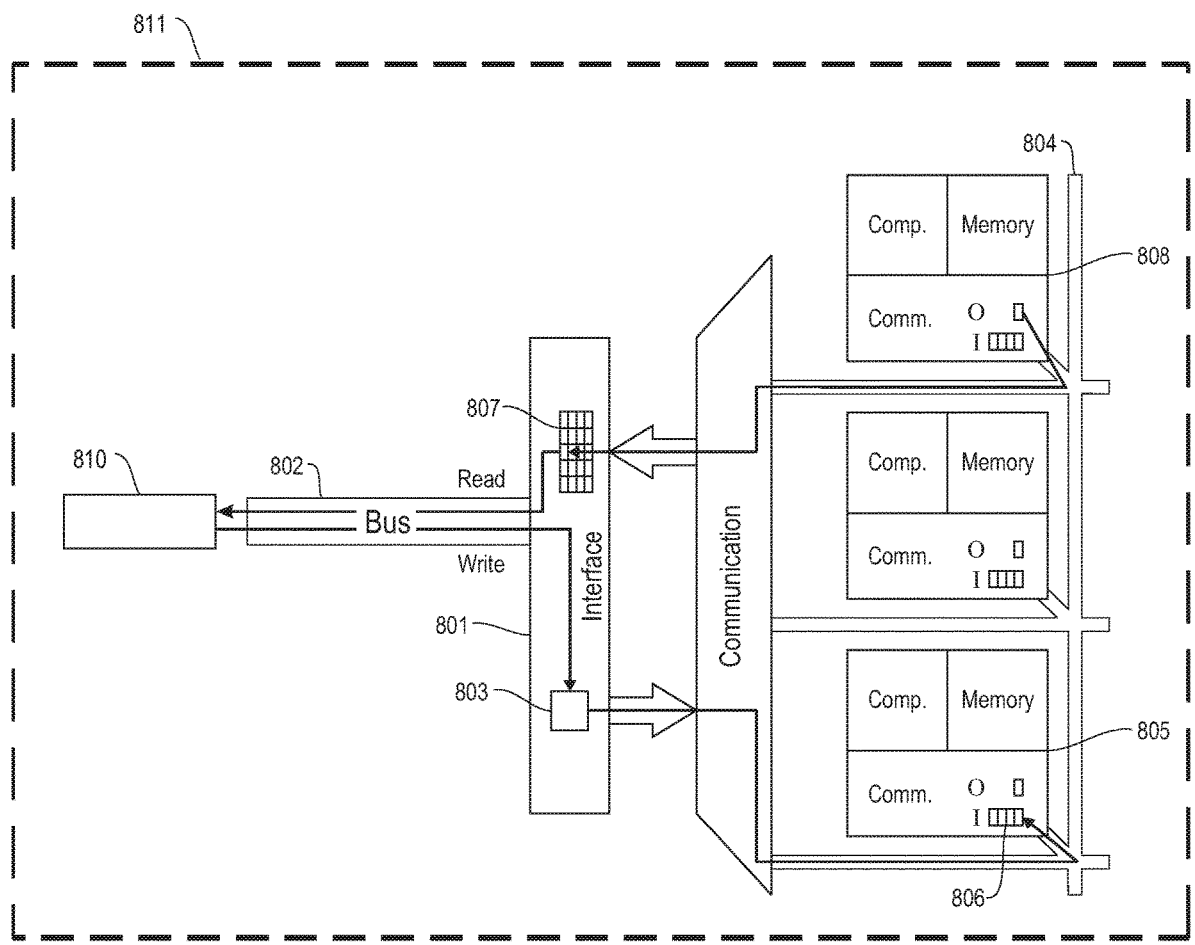
FIG. 11 illustrates a combined memory mapped and message passing system according to embodiments of the present disclosure.

Interface 801 also includes output buffer 807. Buffer 807 stores messages from the message passing system, and may be read directly by the memory-mapped system as set forth above. A core 808 pushes output messages to the output buffer 807 via the network 804. In some embodiments, each core includes an output buffer, while in some embodiments output is sent directly to the network without buffering on the core. In this exemplary embodiment, data is written to core input buffers for ingestion to axons, and a unified output buffer is provided to which data is read from output neurons. From the unified buffer, core output data is readable via the memory map. As pictured, in some embodiments, the output buffers, whether unified or separate, are physically located in interface Block 801 instead of in individual cores 805, 808. A unified output buffer has size $C_o*N_o*B_o$. As shown in FIG. 11, in some embodiments, a computing node 810 is operatively coupled to the interface, the computing node being adapted to access the interface via bus 802. In some embodiments, the computing node, the interface, and the message passing system are located on a single chip 811.

As set forth above, various embodiments provide address translation from the memory mapped to message passing domain. A memory mapped write request is received. The memory address is converted to an address used for routing the message packet. For example, in some embodiments, an X,Y core address is provided. In some embodiments, this address translation is performed algorithmically. In some embodiments, this address translation is provided through a look-up table (LUT). In some embodiments, a combination of algorithmic address translation and a look-up table is used.

As set forth above, various embodiments provide address translation from the message passing to the memory mapped domain. The message packet address is used to route an output message of a given core to the output buffer and to index into the appropriate location in the output buffer. The output buffer is part of the global memory map, and may be read through a read operation over the bus in the memory mapped domain. After a segment of the output buffer is read, it can be cleared in preparation for subsequent writes from the message passing system.

In various embodiments, the interface unit has a standard bus interface connecting to the memory mapped system. In various embodiments, the bus conforms with the Advanced eXtensible Interface (AXI) or other Advanced Microcontroller Bus Architecture (AMBA) standards. In various embodiments, the interface unit has an interface connecting to the message passing system. In various embodiments, the interface conforms to a standard communication protocol such as Address Event Representation (AER) or Message Passing Interface (MPI).

Systems of the present disclosure support arbitrary bus protocols. Accordingly, some embodiments include Direct Memory Access (DMA), while some do not. For example, some embodiments, implement single bus transactions. Some embodiments implement Memory-Mapped I/O (MMIO) or Port-Mapped I/O (PMIO). Some embodiments implement burst bus transactions (e.g., DMA). DMA can block transfer directly to the write address translation unit, or directly read transfer a full frame from the output buffer, thereby increasing performance for certain use cases. In some embodiments using DMA, one or more DMA bus masters are provided.

The present disclosure is useful for integrating memory mapped and message passing systems in a System-on-Chip (SoC). In some such embodiments, the message passing system may be an IP block that resides on a standard bus (e.g., AMBA or AXI).

In some embodiment described above, there is a 1:1 mapping between addresses in the memory mapped domain and addresses in the message passing domain, which are translated via an interface unit. However, in some embodiments, destination domains are addressed using a combination of address and data in the source domain. In such embodiments, the message itself includes addressing information. Such embodiments require that the source processor is the source domain explicitly compute addresses in order to insert (or remove) them in the output data. This reduces the size of the memory space required by encoding some of the address in data.

For example, in a 1:1 mapping of the time/neuron array to the memory space allows processors to address each and every local address in the message passing domain individually and directly. This results in a large memory space, but requires no address computation by the processor. Alternatively, all of the address can be encoded in the data. In this case, the memory map address space is reduced to a single address with a FIFO behind it. This results in a small memory space, with all address computation by processor. Combining these approaches allows the size of the memory space to be somewhere between these two extremes, leading to a tradeoff of complexity in the decoding logic (and computation) between the two interfaces and how much of the memory space is consumed.

It will be appreciated that the systems and methods of the present disclosure are suitable for integration with various peripherals. A bus according to the present disclosure may have multiple bus masters, e.g., for sensors, actuators, neurosynaptic systems, processors, or peripherals. Each system component is assigned a memory space, and can send to any other system component's memory space, when it has control of the bus. An arbiter controls which bus master has the bus at any given time. In some embodiments, a DMA engine is used to transfer data between component memory spaces. In this way, seamless system integration is provided between traditional processor systems, message passing systems, and peripheral devices such as sensor and actuators.

Combined memory mapped/message passing systems according to the present disclosure may be implemented on the same die to minimize power consumption and latency (by minimizing data travel distance), while maintaining throughput. Pipelining at the interface is provided in various embodiments to meet throughput targets as necessary. Such systems may also be implemented as separate dies or chips to allow use of various process technologies such as PCM, memristors, nanotubes, or optics. In some embodiments, a Serializer/Deserializer (SerDes) is used to increase interface block performance for longer communication distances. According to various embodiments, physical communication primitives may be implemented using interfaces such as Ethernet and PCIe.

In various alternative embodiments, writes are made directly to core input buffers for ingestion to axons, while neuron outputs are read from core output buffers. In such embodiments, a read operation generates a read request message, saves the address, and sends the read request message to the core. The core responds with a data message, which is correlated to the read address. The data is then returned on the bus. This generally results in more overhead than maintaining an output buffer in a single interface embodiment, and thus has higher latency.

In various alternative embodiments, writes are made to core input buffers for ingestion to axons, while neuron outputs are read from an output buffer in main memory. In such embodiments, message passing output is pushed to main memory using DMA. This minimizes the size of the memory required for the output buffer, particularly for spatially sparse output. However, such a DMA engine must be able to perform arbitrary memory access (a scatter write). This operation is generally inefficient, and thus such embodiments generally underperform those that include a single output buffer in the interface.

Figure 9:
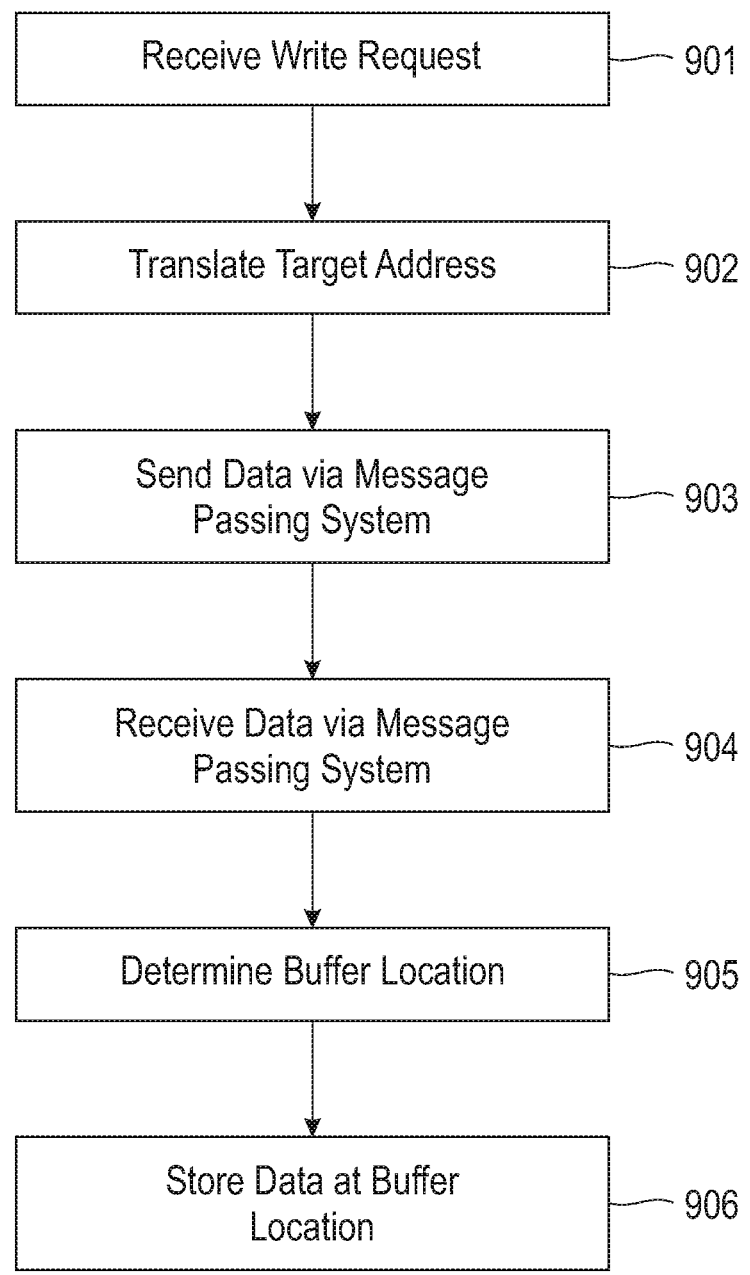
FIG. 9 illustrates a method of interfacing a memory mapped system and a message passing system according to embodiments of the present disclosure.

With reference now to FIG. 9, a method of interfacing a memory mapped system and a message passing system is illustrated according to embodiments of the present disclosure. At 901, a write request is received. The write request comprises first data and a first target address. The first target address is a memory address within a memory map. At 902, the first target address is translated into a second target address. The second target address identifies a destination core. At 903, the first data is sent via a message passing system according to the second target address to the destination core.

At 904, a message is received via a message passing system from a source core. The message comprises second data. At 905, a location in a buffer is determined based on the source core. At 906, the second data is stored at the first location in the buffer. The buffer is accessible via a memory map. It will be appreciated that in any given embodiment, steps 901-903 may be executed separately from steps 904-906, and likewise a given embodiment may include only steps 901-903 or only 904-906 according to whether messages are flowing from or to a message passing system.

According to various embodiments, methods and systems for seamlessly interconnecting a memory-mapped (MM) system and a message passing (MP) system are provided. In some embodiments, the message passing system is a neurosynaptic system. In some embodiments, the memory-mapped and message-passing systems are integrated on a System-on-Chip (SoC). In some embodiments, an interface unit translates between memory-mapped addresses and message-passing addresses. In some embodiments, MM to MP address conversion is performed algorithmically, by a look-up table, or by a combination thereof. In some embodiments, MP to MM address conversion is performed using an output buffer. In some embodiments, address mapping between systems is provided by a combination of address and data. In some embodiments, the memory-mapped system includes multiple bus masters or peripheral devices.

Figure 10:
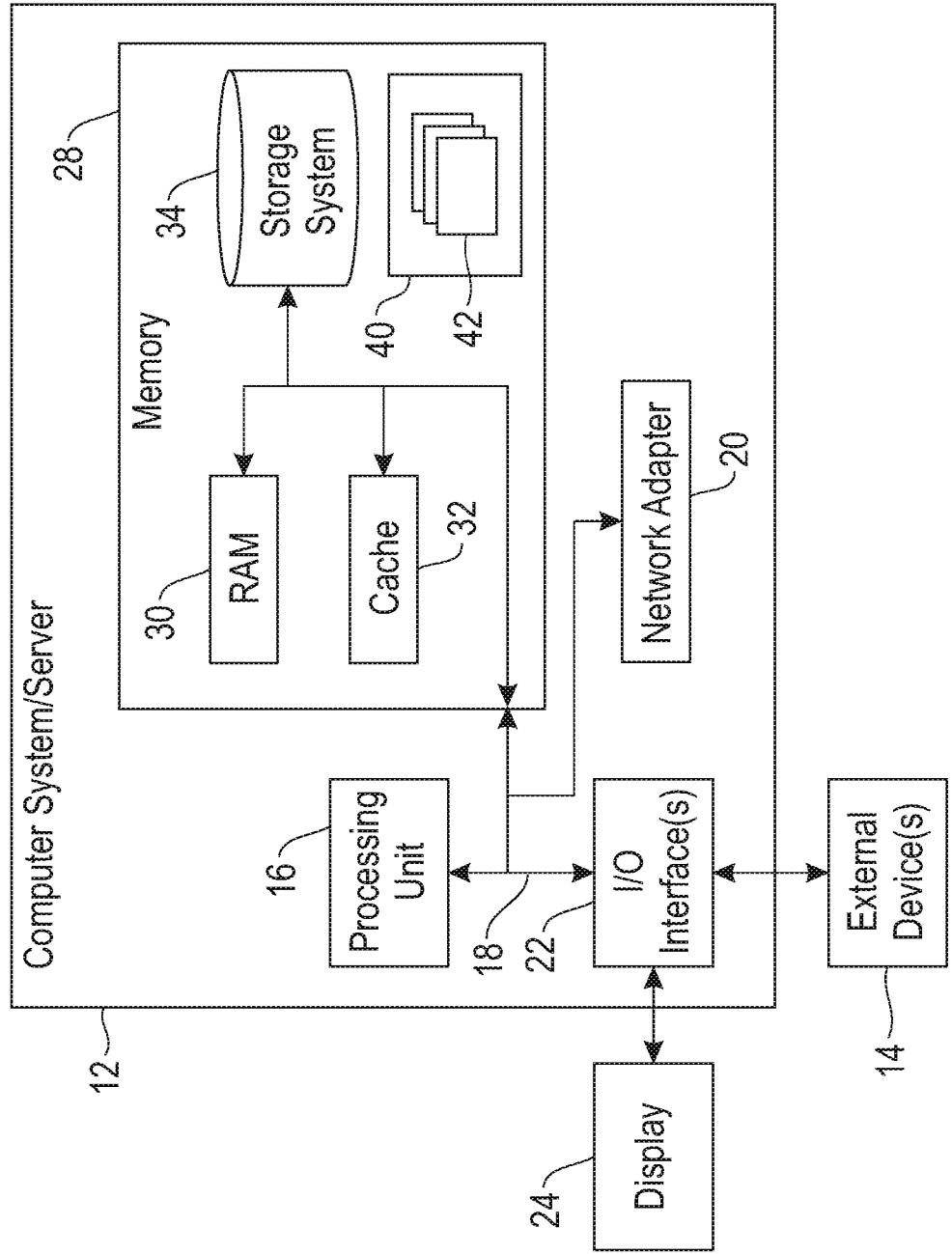
FIG. 10 depicts a computing node according to an embodiment of the present invention.

Referring now to FIG. 10, a schematic of an example of a computing node is shown. Computing node 10 is only one example of a suitable computing node and is not intended to suggest any limitation as to the scope of use or functionality of embodiments of the invention described herein. Regardless, computing node 10 is capable of being implemented and/or performing any of the functionality set forth hereinabove.

In computing node 10 there is a computer system/server 12, which is operational with numerous other general purpose or special purpose computing system environments or configurations. Examples of well-known computing systems, environments, and/or configurations that may be suitable for use with computer system/server 12 include, but are not limited to, personal computer systems, server computer systems, thin clients, thick clients, handheld or laptop devices, multiprocessor systems, microprocessor-based systems, set top boxes, programmable consumer electronics, network PCs, minicomputer systems, mainframe computer systems, and distributed cloud computing environments that include any of the above systems or devices, and the like.

Computer system/server 12 may be described in the general context of computer system-executable instructions, such as program modules, being executed by a computer system. Generally, program modules may include routines, programs, objects, components, logic, data structures, and so on that perform particular tasks or implement particular abstract data types. Computer system/server 12 may be practiced in distributed cloud computing environments where tasks are performed by remote processing devices that are linked through a communications network. In a distributed cloud computing environment, program modules may be located in both local and remote computer system storage media including memory storage devices.

As shown in FIG. 10, computer system/server 12 in computing node 10 is shown in the form of a general-purpose computing device. The components of computer system/server 12 may include, but are not limited to, one or more processors or processing units 16, a system memory 28, and a bus 18 that couples various system components including system memory 28 to processor 16.

Bus 18 represents one or more of any of several types of bus structures, including a memory bus or memory controller, a peripheral bus, an accelerated graphics port, and a processor or local bus using any of a variety of bus architectures. By way of example, and not limitation, such architectures include Industry Standard Architecture (ISA) bus, Micro Channel Architecture (MCA) bus, Enhanced ISA (EISA) bus, Video Electronics Standards Association (VESA) local bus, and Peripheral Component Interconnect (PCI) bus.

Computer system/server 12 typically includes a variety of computer system readable media. Such media may be any available media that is accessible by computer system/server 12, and it includes both volatile and non-volatile media, removable and non-removable media.

System memory 28 can include computer system readable media in the form of volatile memory, such as random access memory (RAM) 30 and/or cache memory 32. Computer system/server 12 may further include other removable/non-removable, volatile/non-volatile computer system storage media. By way of example only, storage system 34 can be provided for reading from and writing to a non-removable, non-volatile magnetic media (not shown and typically called a "hard drive"). Although not shown, a magnetic disk drive for reading from and writing to a removable, non-volatile magnetic disk (e.g., a "floppy disk"), and an optical disk drive for reading from or writing to a removable, non-volatile optical disk such as a CD-ROM, DVD-ROM or other optical media can be provided. In such instances, each can be connected to bus 18 by one or more data media interfaces. As will be further depicted and described below, memory 28 may include at least one program product having a set (e.g., at least one) of program modules that are configured to carry out the functions of embodiments of the invention.

Program/utility 40, having a set (at least one) of program modules 42, may be stored in memory 28 by way of example, and not limitation, as well as an operating system, one or more application programs, other program modules, and program data. Each of the operating system, one or more application programs, other program modules, and program data or some combination thereof, may include an implementation of a networking environment. Program modules 42 generally carry out the functions and/or methodologies of embodiments of the invention as described herein.

Computer system/server 12 may also communicate with one or more external devices 14 such as a keyboard, a pointing device, a display 24, etc.; one or more devices that enable a user to interact with computer system/server 12; and/or any devices (e.g., network card, modem, etc.) that enable computer system/server 12 to communicate with one or more other computing devices. Such communication can occur via Input/Output (I/O) interfaces 22. Still yet, computer system/server 12 can communicate with one or more networks such as a local area network (LAN), a general wide area network (WAN), and/or a public network (e.g., the Internet) via network adapter 20. As depicted, network adapter 20 communicates with the other components of computer system/server 12 via bus 18. It should be understood that although not shown, other hardware and/or software components could be used in conjunction with computer system/server 12. Examples, include, but are not limited to: microcode, device drivers, redundant processing units, external disk drive arrays, RAID systems, tape drives, and data archival storage systems, etc.

The present invention may be a system, a method, and/or a computer program product. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, or either source code or object code written in any combination of one or more programming languages, including an object oriented programming language such as Smalltalk, C++ or the like, and conventional procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A system comprising:
a neural network processor system, comprising at least one neural network processing core interconnected by a network; and
an interface operatively connected to the network, the interface comprising a memory map, the memory map comprising a first region corresponding to inputs to the neural network processor system and a second region corresponding to outputs from the neural network processor system, the interface further comprising a buffer, wherein
the interface is adapted to receive a message via the network from a source neural network processing core, the message comprising message data and at least one address, and
the interface is adapted to store the message data in the buffer at a location,
the at least one address corresponding to the location in the buffer.

2. The system of claim 1, wherein:
the interface is adapted to receive a write request comprising write data and a write address, the write address corresponding to a location within the first region of the memory map; and
the interface is adapted to send the write data via the network to at least one input location of a destination neural network processing core.

3. The system of claim 2, wherein the interface comprises an address translator, the address translator being adapted to:
translate the write address into a target address, the target address identifying the at least one input location of the destination neural network processing core.

4. The system of claim 3, wherein the translating comprises applying a predetermined function.

5. The system of claim 3, wherein the translating comprises accessing a lookup table.

6. The system of claim 2, further comprising:
a bus operatively coupled to the interface, wherein:
the interface is adapted to receive the write request via the bus.

7. The system of claim 2, wherein:
the at least one neural network processing core comprises a neurosynaptic core, the neurosynaptic core having a plurality of input axons and output neurons;
the network comprises an inter-core network;
the destination neural network processing core comprises a neurosynaptic core;
the write address corresponds to one or more input axons of the neurosynaptic core of the destination neural network processing core; and
the write data comprises a plurality of axon inputs to the neurosynaptic core of the destination neural network processing core.

8. The system of claim 1, wherein:
the interface is adapted to receive a read request comprising a read address, the read address corresponding to a location within the second region of the memory map; and
the interface is adapted to return read data to an originator of the read request, the read data comprising an output of a source neural network processing core.

9. The system of claim 8, wherein the interface comprises an address translator and wherein:
the address translator is adapted to determine an address within the second region of the memory map based on the at least one address; and
the interface is adapted to provide the read data in response to a read request comprising the address within the second region.

10. The system of claim 8, further comprising:
a bus operatively coupled to the interface, wherein:
the interface is adapted to receive the read request via the bus.

11. The system of claim 8, wherein:
the at least one neural network processing core comprises a neurosynaptic core, the neurosynaptic core having a plurality of input axons and output neurons;
the network comprises an inter-core network;

the source neural network processing core comprises a neurosynaptic core;

the read address corresponds to one or more output neurons of the neurosynaptic core of the source neural network processing core; and the read data comprises a plurality of neuron outputs of the neurosynaptic core of the source neural network processing core.

12. The system of claim 1, further comprising:
a sensor operatively connected to the interface, the sensor being adapted to transmit sensor outputs to the neural network processor system via the interface.

13. The system of claim 1, further comprising:
an actuator operatively connected to the interface, the actuator being adapted to receive inputs from the neural network processor system via the interface.

14. The system of claim 1, further comprising:
a computing node operatively coupled to the interface, the computing node being adapted to access the interface via direct memory access (DMA).

15. The system of claim 1, further comprising:
a computing node operatively coupled to the interface, the computing node being adapted to access the interface via a bus.

16. The system of claim 15, wherein the computing node, the interface, and the neural network processor system are located on a single chip.

17. A method comprising:
receiving a message at an interface via a network from a source neural network processing core of a neural network processor system,
    the message comprising message data and at least one address,
    the interface comprising a memory map,
    the memory map comprising a first region corresponding to inputs to the neural network processor system and a second region corresponding to outputs from the neural network processor system,
    the interface comprising a buffer; and
storing the message data in the buffer of the interface at a location,
    the at least one address corresponding to the location in the buffer.

18. The method of claim 17, further comprising:
receiving a write request comprising write data and a write address, the write address corresponding to a location within the first region of the memory map; and
sending the write data via the network to at least one input location of a destination neural network processing core.

19. The method of claim 17, further comprising:
receiving a read request comprising a read address, the read address corresponding to a location within the second region of the memory map; and
returning read data to an originator of the read request, the read data comprising an output of a source neural network processing core.

20. A computer program product for interfacing a memory mapped system with a message passing system, the computer program product comprising a computer readable storage medium having program instructions embodied therewith, the program instructions executable by a processor to cause the processor to perform a method comprising:
receiving a message at an interface via a network from a source neural network processing core of a neural network processor system,
    the message comprising message data and at least one address,
    the interface comprising a memory map,
    the memory map comprising a first region corresponding to inputs to the neural network processor system and a second region corresponding to outputs from the neural network processor system,
    the interface comprising a buffer; and
storing the message data in the buffer of the interface at a location,
    the at least one address corresponding to the location in the buffer.

* * * * *